(12) United States Patent
Xie et al.

(10) Patent No.: US 10,699,942 B2
(45) Date of Patent: Jun. 30, 2020

(54) VERTICAL-TRANSPORT FIELD-EFFECT TRANSISTORS HAVING GATE CONTACTS LOCATED OVER THE ACTIVE REGION

(71) Applicant: GLOBALFOUNDRIES Inc., Grand Cayman (KY)

(72) Inventors: Ruilong Xie, Niskayuna, NY (US); Chanro Park, Clifton Park, NY (US); Daniel Chanemougame, Niskayuna, NY (US); Steven Soss, Cornwall, NY (US); Lars Liebmann, Mechanicville, NY (US); Hui Zang, Guilderland, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 48 days.

(21) Appl. No.: 15/961,337

(22) Filed: Apr. 24, 2018

(65) Prior Publication Data
US 2019/0326165 A1 Oct. 24, 2019

(51) Int. Cl.
| | |
|---|---|
| H01L 21/768 | (2006.01) |
| H01L 29/66 | (2006.01) |
| H01L 23/528 | (2006.01) |
| H01L 21/8234 | (2006.01) |
| H01L 23/522 | (2006.01) |
| H01L 29/78 | (2006.01) |

(52) U.S. Cl.
CPC ........... *H01L 21/76816* (2013.01); *H01L 21/823475* (2013.01); *H01L 23/528* (2013.01); *H01L 23/5226* (2013.01); *H01L 29/66666* (2013.01); *H01L 29/7827* (2013.01)

(58) Field of Classification Search
None
See application file for complete search history.

(56) References Cited

U.S. PATENT DOCUMENTS 9,825,032 B1 * 11/2017 Bentley ............ H01L 29/41791
10,056,379 B1 * 8/2018 Balakrishnan ...... H01L 29/0653

OTHER PUBLICATIONS

Bentley et al., "Method and Structure to Control Channel Length in Vertical Fet Device" filed Nov. 15, 2016 as U.S. Appl. No. 15/351,747.

* cited by examiner

*Primary Examiner* — Moazzam Hossain
*Assistant Examiner* — Stanetta D Isaac
(74) *Attorney, Agent, or Firm* — Thompson Hine LLP; Anthony Canale

(57) ABSTRACT

Methods and structures that include a vertical-transport field-effect transistor. First and second semiconductor fins are formed that project vertically from a bottom source/drain region. A first gate stack section is arranged to wrap around a portion of the first semiconductor fin, and a second gate stack section is arranged to wrap around a portion of the second semiconductor fin. The first gate stack section is covered with a placeholder structure. After covering the first gate stack section with the placeholder structure, a metal gate capping layer is deposited on the second gate stack section. After depositing the metal gate capping layer on the second gate stack section, the placeholder structure is replaced with a contact that is connected with the first gate stack section.

7 Claims, 11 Drawing Sheets

VERTICAL-TRANSPORT FIELD-EFFECT TRANSISTORS HAVING GATE CONTACTS LOCATED OVER THE ACTIVE REGION

BACKGROUND

The present invention relates to semiconductor device fabrication and integrated circuits and, more specifically, to methods for forming a vertical-transport field-effect transistor and structures for a vertical-transport field-effect transistor.

Device structures for a field-effect transistor generally include a source, a drain, and a gate electrode configured to switch carrier flow in a channel formed between the source and drain. When a control voltage exceeding a designated threshold voltage is applied to the gate electrode, carrier flow occurs in the channel between the source and drain to produce a device output current. The channel of a planar field-effect transistor is located beneath the top surface of a substrate on which the gate electrode is supported.

Planar field-effect transistors and fin-type field-effect transistors constitute a general category of field-effect transistor structures in which the direction of gated current in the channel is in a horizontal direction that is parallel to the substrate surface. A vertical-transport field-effect transistor is a type of non-planar field-effect transistor in which the source and the drain are arranged at the top and bottom of a semiconductor fin. The direction of gated current in the channel of a vertical-transport field-effect transistor is in a vertical direction relative to the substrate surface and, therefore, in a direction parallel to the height of a semiconductor fin.

SUMMARY

In an embodiment, a structure includes a vertical-transport field effect transistor with a bottom source/drain region, a top source/drain region, a semiconductor fin that extends from the bottom source/drain region to the top source/drain region, and a gate stack section arranged to wrap around a portion of the semiconductor fin. The structure further includes an interlayer dielectric layer over the vertical-transport field effect transistor, and a contact located in the interlayer dielectric layer over the bottom source/drain region. The contact extends vertically through the interlayer dielectric layer to contact the gate stack section. The contact is arranged relative to the bottom source/drain region to surround the gate stack section.

In an embodiment, a method includes forming a first semiconductor fin and a second semiconductor fin that each project vertically from a bottom source/drain region, forming a first gate stack section arranged to wrap around a portion of the first semiconductor fin and a second gate stack section arranged to wrap around a portion of the second semiconductor fin, and covering the first gate stack section with a placeholder structure. After covering the first gate stack section with the placeholder structure, a metal gate capping layer is deposited on the second gate stack section. After depositing the metal gate capping layer on the second gate stack section, the placeholder structure is replaced with a contact that is connected with the first gate stack section.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1B is a top view in which FIG. 1 is taken generally along line 1-1 and FIG. 1A is taken generally along line 1A-1A.

DETAILED DESCRIPTION

Figure 1:
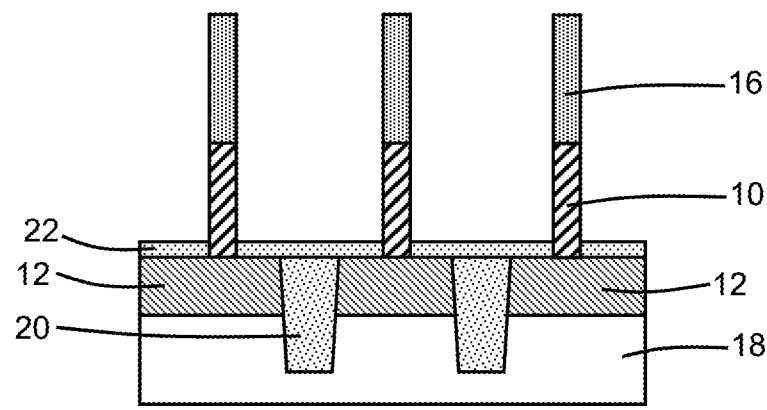
FIGS. 1 and 1A are cross-sectional views of a structure at an initial fabrication stage of a processing method in accordance with embodiments of the invention.
Figure 1A:
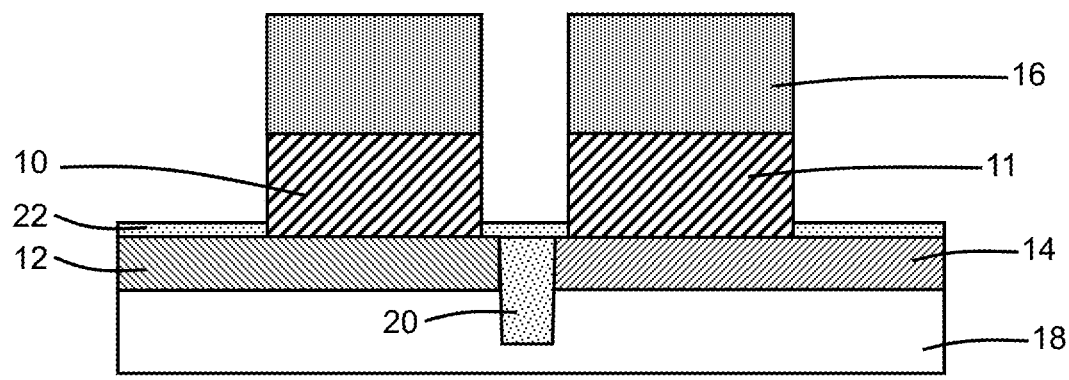
Figure 1B:
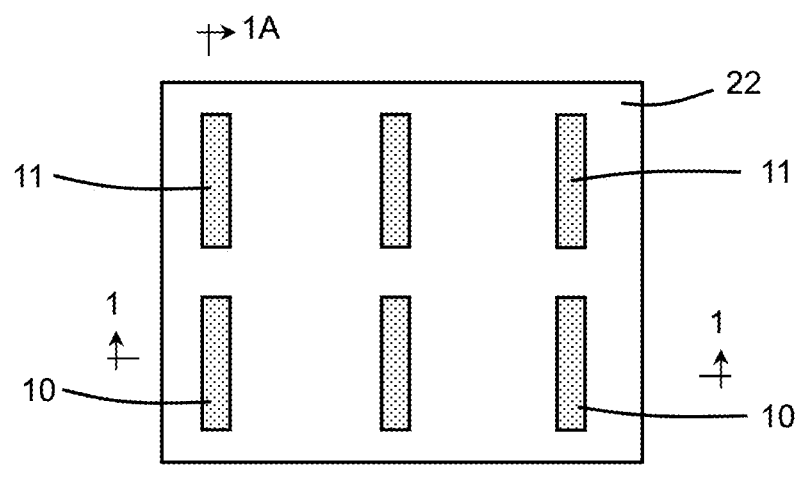

With reference to FIGS. 1, 1A, 1B and in accordance with embodiments of the invention, fins 10 project in a vertical direction from respective bottom source/drain regions 12 and fins 11 project in a vertical direction from respective bottom source/drain regions 14. As used herein, the term "source/drain region" connotes a doped region of semiconductor material that can function as either a source or a drain of a vertical-transport field-effect transistor. The fins 10, 11 and the bottom source/drain regions 12, 14 are used to form vertical-transport field-effect transistors as described hereinbelow. The fins 10, 11 may be formed from an epitaxial layer of semiconductor material, such as undoped or intrinsic epitaxial silicon, that is grown on the bottom source/drain regions 12, 14 and patterned using, for example, self-aligned double patterning (SADP) or self-aligned quadruple patterning (SAQP). Sections of a hardmask 16 comprised of a dielectric material, such as silicon nitride ($Si_3N_4$), may be disposed on the top surfaces of the fins 10, 11 as an artifact of the patterning process.

The bottom source/drain regions 12, 14 are arranged on a substrate 18, and may be formed by respective epitaxial growth processes. In connection with the formation of an n-type vertical-transport field effect transistor, the bottom source/drain regions 12 may be comprised of a semiconductor material that includes an n-type dopant from Group V of the Periodic Table (e.g., phosphorus (P) and/or arsenic (As)) providing n-type electrical conductivity. In connection with the formation of a p-type vertical-transport field effect transistor, the bottom source/drain regions 14 may be comprised of a semiconductor material that includes a p-type dopant from Group III of the Periodic Table (e.g., boron (B), aluminum (Al), gallium (Ga), and/or indium (In)) providing p-type electrical conductivity.

Shallow trench isolation regions 20 may be formed to electrically isolate the bottom source/drain regions 12 and the bottom source/drain regions 14. The shallow trench isolation regions 20 may be comprised of a dielectric material such as an oxide of silicon (e.g., silicon dioxide ($SiO_2$)). In the representative embodiment, the shallow trench isolation regions 20 are arranged such that each of the bottom source/drain regions 12 is associated with one of the fins 10 and each of the bottom source/drain regions 14 is associated with one of the fins 11. However, in multiple-fin device structures, multiple fins 10 may be associated with each of the bottom source/drain regions 12, and multiple fins 11 may be associated with each of the bottom source/drain regions 14.

A bottom spacer layer 22 is arranged on the bottom source/drain regions 12, 14. The bottom spacer layer 22 may be comprised of a dielectric material, such as silicon nitride ($Si_3N_4$), that is deposited by a directional deposition technique, such as high-density plasma (HDP) deposition or gas cluster ion beam (GCIB) deposition. The fins 10, 11 extend in the vertical direction through the thickness of the bottom spacer layer 22.

Figure 2:
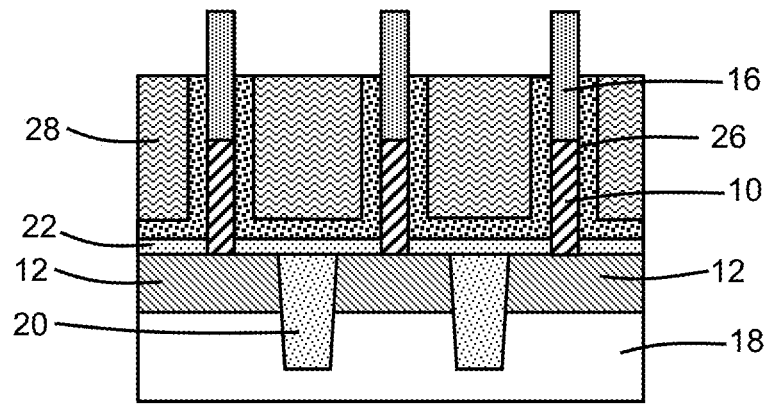
FIGS. 2-11 and 2A-11A are cross-sectional views of the structure at successive fabrication stages of the processing method subsequent to, respectively, FIGS. 1, 1A.
Figure 2A:
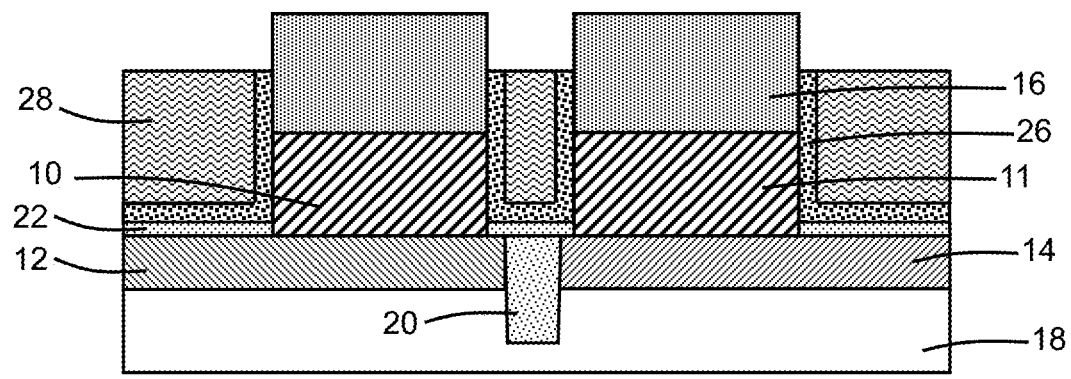

With reference to FIGS. 2, 2A in which like reference numerals refer to like features in FIGS. 1, 1A and at a subsequent fabrication stage, a gate stack 26 is formed on the bottom spacer layer 22 and has a surrounding relationship with a portion of each of the fins 10, 11. The gate stack 26 includes one or more work function metal layers and a gate dielectric layer arranged between the one or more work function metal layers and the sidewalls of the fins 10, 11. The gate dielectric layer may be comprised of a dielectric material, such as a high-k dielectric material (e.g., a hafnium-based dielectric material like hafnium oxide ($HfO_2$)) having a dielectric constant (e.g., permittivity) higher than the dielectric constant of $SiO_2$. The one or more conformal work function metal layers may be comprised of titanium aluminum carbide (TiAlC) and/or titanium nitride (TiN). The layers of the gate stack 26 may be serially deposited by, for example, atomic layer deposition (ALD), physical vapor deposition (PVD), and/or chemical vapor deposition (CVD). The composition of the one or more work function metals that surround the fins 10 may differ from the composition of the one or more work function metals that surround the fins 11 in order to form vertical-transport field-effect transistors of different types.

A spin-on hardmask 28 is applied and etched back to provide an etch mask for chamfering the gate stack 26 with an etching process. The spin-on hardmask 28 may be comprised of an organic planarization layer (OPL) material.

Figure 3:
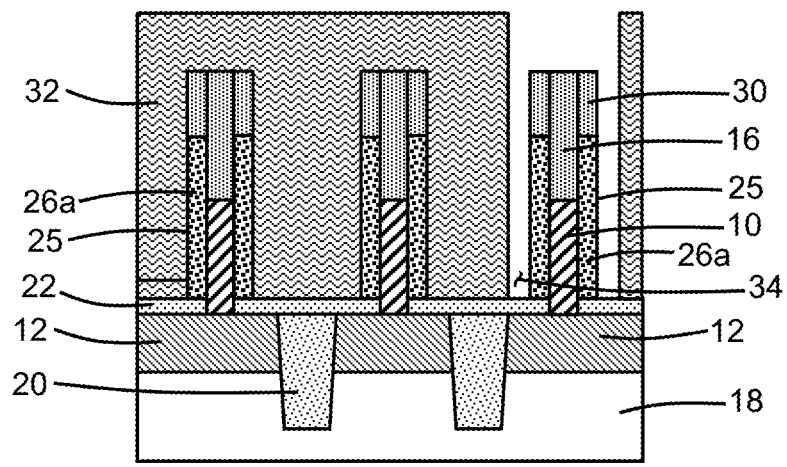
Figure 3A:
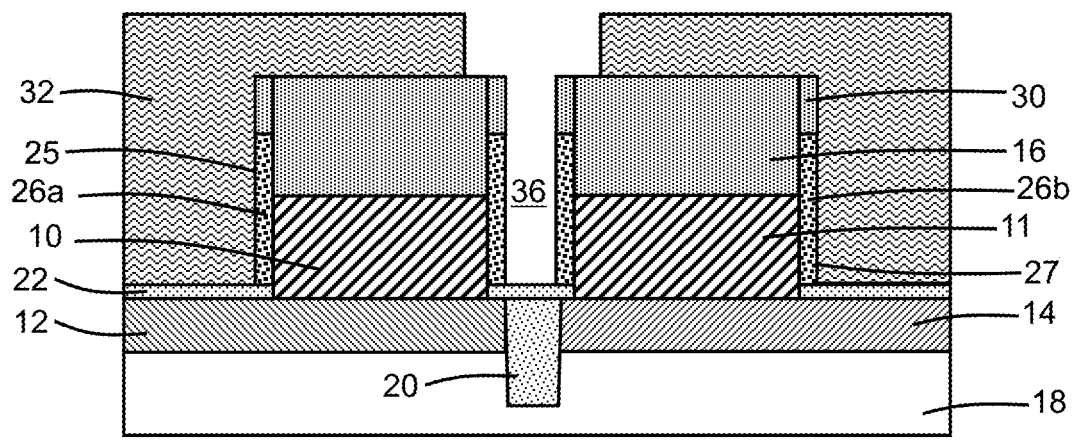

With reference to FIGS. 3, 3A in which like reference numerals refer to like features in FIGS. 2, 2A and at a subsequent fabrication stage, spacers 30 are formed over the chamfered gate stack 26. The spacers 30 may be formed by depositing a conformal layer comprised of a dielectric material, such as silicon nitride ($Si_3N_4$), and shaping the conformal layer with an etching process, such as reactive ion etching (ME). The spin-on hardmask 28 may be removed by ashing with a plasma after the spacers are formed.

Sections of the gate stack 26 are removed from the bottom spacer layer 22 with an etching process, such as reactive ion etching (RIE), that removes the gate stack 26 selective to the materials of the bottom spacer layer 22 and the spacers 30. The etching process cuts the gate stack 26 into individual gate stack sections 26a that are associated with the fins 10 as gate structures, and into individual gate stack sections 26b that are associated with the fins 11 as gate structures. The gate stack sections 26a on the different fins 10 are disconnected from each other and are also disconnected from gate stack sections 26b. Similarly, the gate stack sections 26b on the different fins 11 are disconnected from each other and are also disconnected from gate stack sections 26a. Each of the gate stack sections 26a has a vertical sidewall or surface 25 that is exposed along the height of one of the fins 10 and that surrounds a portion of each fin 10, and each of the gate stack sections 26b has a vertical sidewall or surface 27 that is exposed along the height of one of the fins 11 and that surrounds a portion of each fin 10.

A spin-on hardmask 32, which may be comprised of an organic planarization layer (OPL) material, is applied and patterned with lithography and etching to provide openings 34, 36 arranged for the formation of placeholder structures for gate contacts. The opening 34 in the spin-on hardmask 32 exposes the vertical surface 25 of one of the gate stack sections 26a about the entire perimeter of the fin 10, and the opening 36 in the spin-on hardmask 32 exposes the vertical surface 25 of one of the gate stack sections 26a and the vertical surface 27 of one of the gate stack sections 26b. The gate stack section 26a exposed by the opening 34 is arranged over the active area that includes one of the bottom source/drain regions 12. The gate stack section 26b exposed by the opening 36 is arranged over one of the shallow trench isolation regions 20, and the involved surfaces 25, 27 face each other across the opening 36.

Figure 4:
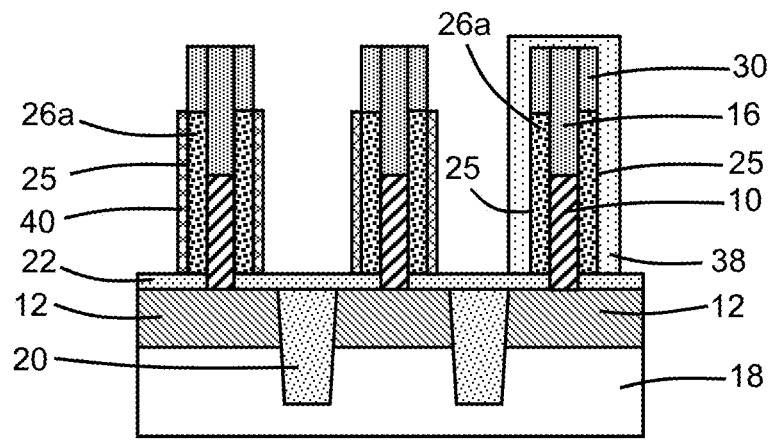
Figure 4A:
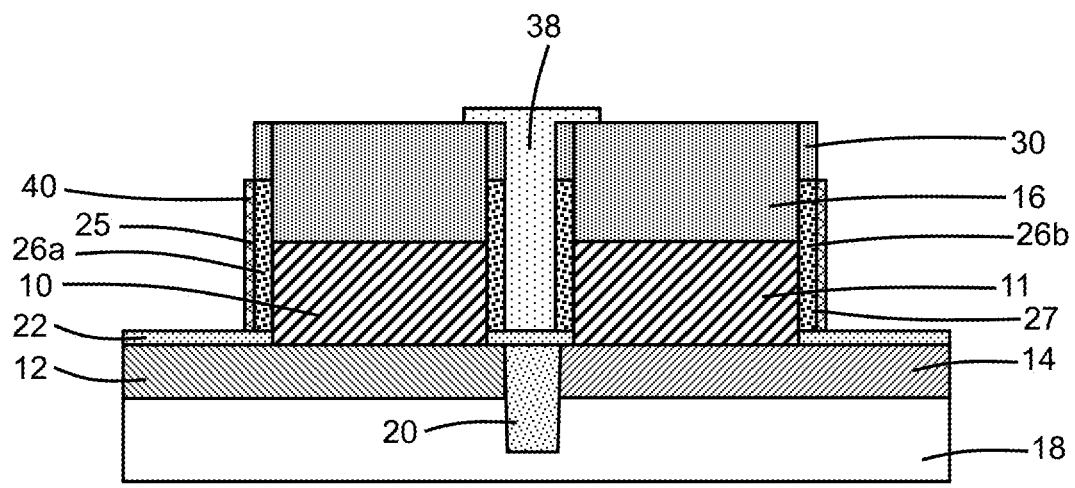

With reference to FIGS. 4, 4A in which like reference numerals refer to like features in FIGS. 3, 3A and at a subsequent fabrication stage, sections of a dielectric layer 38 comprised of a dielectric material, such as silicon carbide (SiC), are deposited to fill the openings 34, 36 and then etched back to a height that is taller than the hardmask 16 on the top surfaces of the fins 10, 11. The spin-on hardmask 28 may be removed by ashing with a plasma after the dielectric layer 38 is deposited and etched bask.

A metal gate capping layer 40 comprised of a conductor, such as tungsten (W), titanium nitride (TiN), cobalt (Co), or ruthenium (Ru), is selectively deposited on the vertical surface 25 of gate stack sections 26a and the vertical surface 27 of gate stack sections 26b, except where deposition is blocked by the sections of the dielectric layer 38 covering the vertical surface 25 of specific gate stack sections 26a and the vertical surface 27 of specific gate stack sections 26b. The metal gate capping layer 40 may be selectively deposited by, for example, atomic layer deposition (ALD) or chemical vapor deposition (CVD) on the exposed metal at the vertical surfaces 25, 27 and not on insulator surfaces.

The addition of the metal gate capping layer 40 locally thickens the gate stack sections 26a, 26b, which may improve conductance and protects the gate stack sections 26a, 26b during subsequent processing. The gate stack sections 26a may include the same thickness of the one or more work function metal layers formed on fins 10 and some of the gate stack sections 26a include the additional thickness of the metal gate capping layer 40. The gate stack sections 26b may include the same thickness of the one or more work function metal layers formed on fins 11 and some of the gate stack sections 26b include the additional thickness of the metal gate capping layer 40. The sections of the dielectric layer 38 provide placeholder structures at which contacts to the gate stack sections 26a, 26b are subsequently formed, and the placeholder structures function to block the deposition of the metal gate capping layer 40 in order to maintain a larger critical dimension, due to the absences of the metal gate capping layer 40, that aids in the subsequent formation of the gate contacts. As a numerical example, the gate stack sections 26a, 26b may have a thickness of six (6) nanometers, and the metal gate capping layer 40 may have a thickness of four (4) nanometers, and the placeholder structures provide an additional four (4) nanometers of clearance between the gate stack sections 26a of adjacent vertical-transport field-effect transistors or between gate stack sections 26b of adjacent vertical-transport field-effect transistors for forming the gate contacts.

Figure 5:
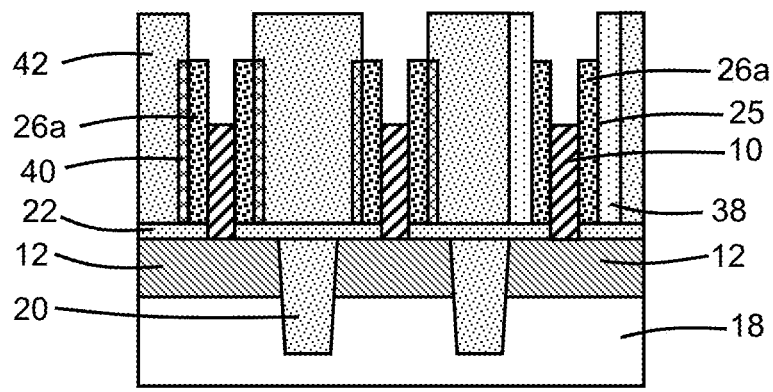
Figure 5A:
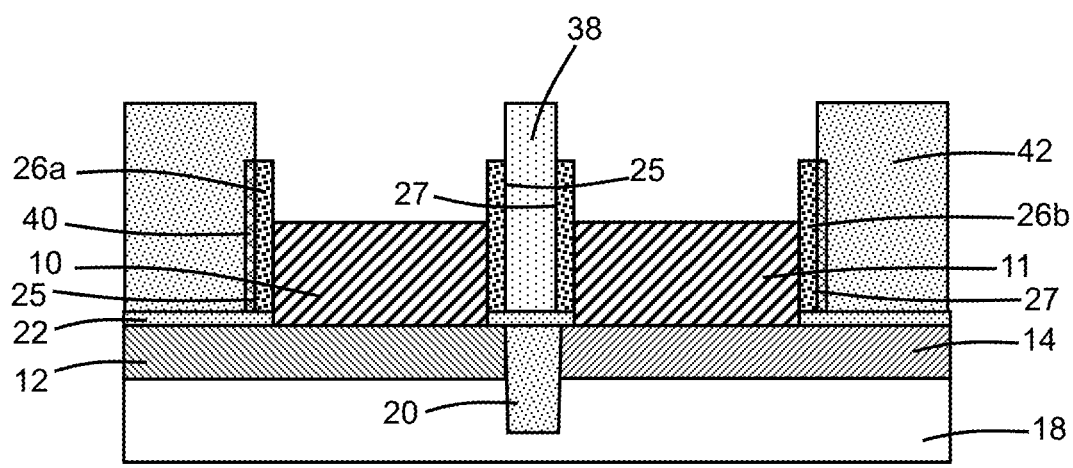

With reference to FIGS. 5, 5A in which like reference numerals refer to like features in FIGS. 4, 4A and at a subsequent fabrication stage, an interlayer dielectric layer 42 is applied and planarized with chemical mechanical polishing (CMP) to be coplanar with the sections of the hardmask 16 on the fins 10, 11. The interlayer dielectric layer 42 may be comprised of a dielectric material, such as an oxide of silicon (e.g., silicon dioxide ($SiO_2$)) deposited by chemical vapor deposition (CVD).

The sections of the hardmask 16 are removed from the top surfaces of the fins 10, 11 and the spacers 30 are removed from over the gate stack sections 26a, 26b with one or more etching processes that remove the constituent dielectric materials selective to the materials of the fins 10, 11, the gate stack sections 26a, 26b, and the interlayer dielectric layer 42. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 6:
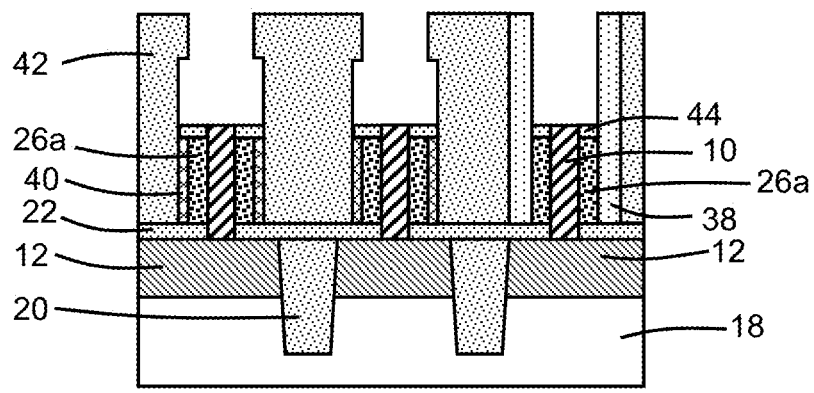
Figure 6A:
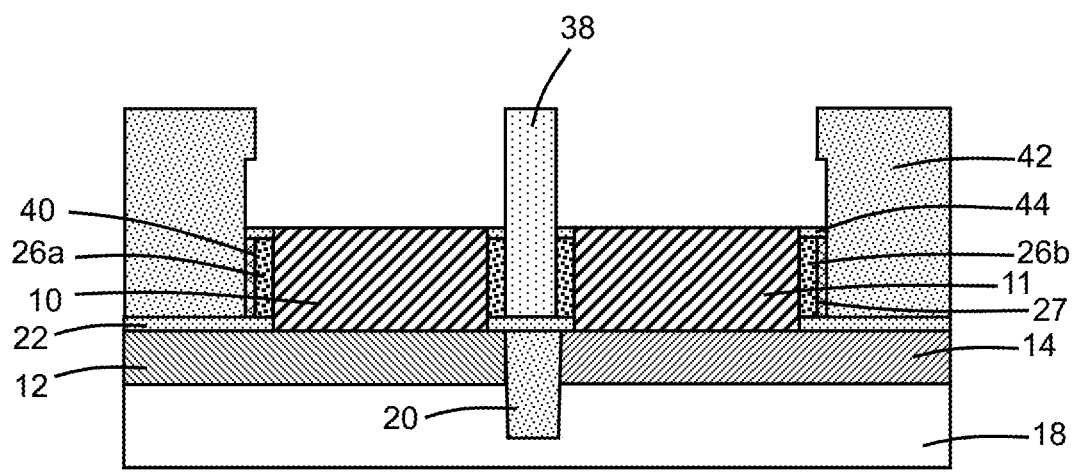

With reference to FIGS. 6, 6A in which like reference numerals refer to like features in FIGS. 5, 5A and at a subsequent fabrication stage, the gate stack sections 26a, 26b and metal gate capping layer 40 are recessed relative to the fins 10, 11 with an isotropic etching process that removes their conductors selective to the material of the fins 10, 11 and the material of the interlayer dielectric layer 42, and a top spacer layer 44 is formed on the gate stack 26. The recessing of the gate stack sections 26a, 26b and metal gate capping layer 40 forms divots as open spaces between the fins 10, 11 and interlayer dielectric layer 42. The top spacer layer 44 may be comprised of a dielectric material, such as silicon nitride ($Si_3N_4$), that is formed by filling the divots using atomic layer deposition (ALD) followed by isotropic etching to remove the deposited dielectric other than the portion that is pinched-off in the divots.

Figure 7:
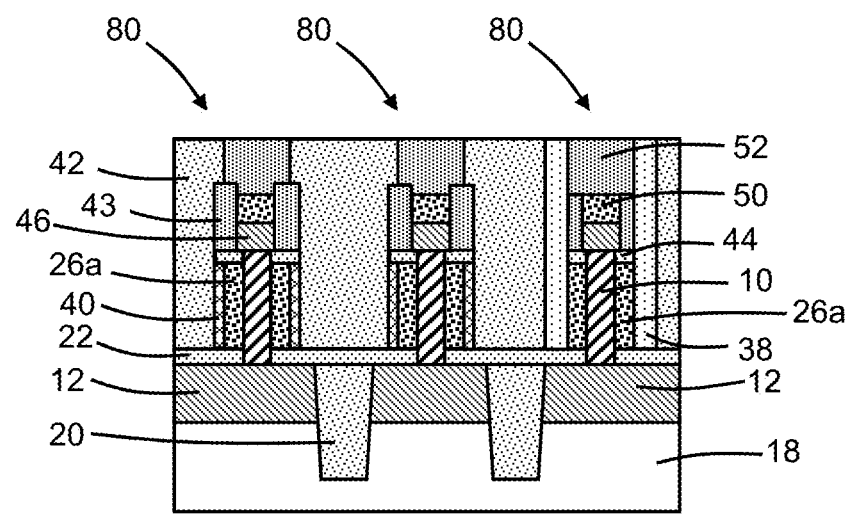
Figure 7A:
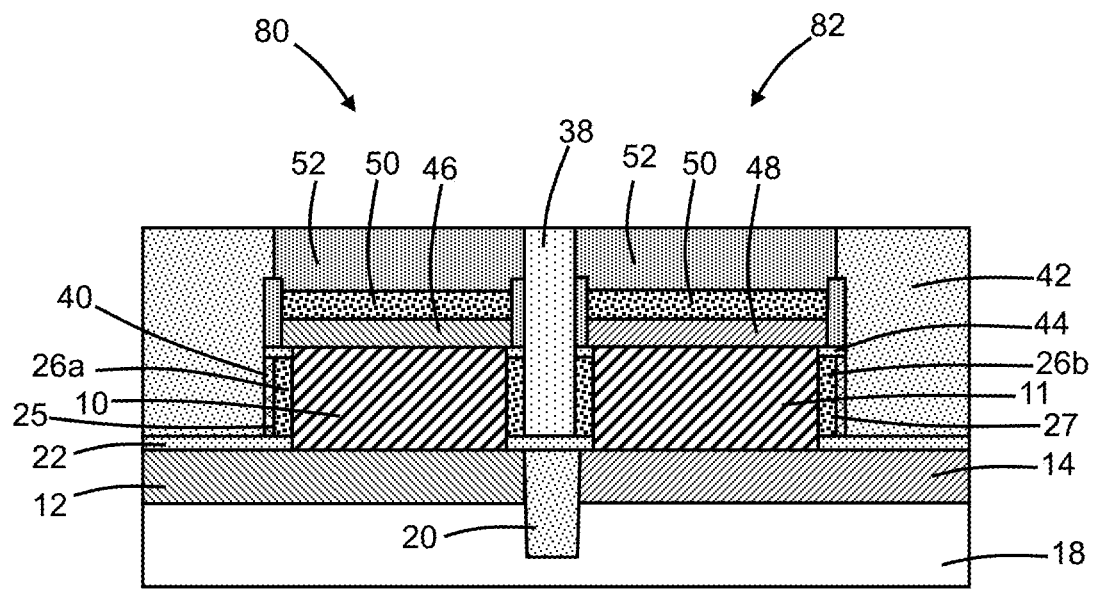

With reference to FIGS. 7, 7A in which like reference numerals refer to like features in FIGS. 6, 6A and at a subsequent fabrication stage, sidewall spacers 43 are formed, followed by the formation of top source/drain regions 46 above the top spacer layer 44 by epitaxial growth from the exposed top surfaces of the fins 10, and the formation of top source/drain regions 48 above the top spacer layer 44 by epitaxial growth from the exposed top surfaces of the fins 11. The top spacer layer 44 electrical isolates and physically separates the top source/drain regions 46, 48 from the gate stack sections 26a, 26b and the metal gate capping layer 40 on the gate stack sections 26a, 26b.

The top source/drain regions 46 may be comprised of semiconductor material that is doped to have the same conductivity type as the bottom source/drain regions 12. If the bottom source/drain regions 12 are n-type, then the top source/drain regions 46 may be respective sections of semiconductor material formed by an epitaxial growth process and may include an n-type dopant from Group V of the Periodic Table (e.g., phosphorus (P) and/or arsenic (As)) providing n-type electrical conductivity. The top source/drain regions 48 may be comprised of semiconductor material that is doped to have the same conductivity type as the bottom source/drain regions 14. If the bottom source/drain regions 14 are p-type, then the top source/drain regions 48 may be a section of semiconductor material formed by an epitaxial growth process and may include a concentration of a p-type dopant from Group III of the Periodic Table (e.g., boron (B), aluminum (Al), gallium (Ga), and/or indium (In)) providing p-type electrical conductivity. In an embodiment, the top source/drain regions 46 and the top source/drain regions 48 may be formed by selective epitaxial growth (SEG) processes in which the constituent semiconductor material nucleates for epitaxial growth on semiconductor surfaces (e.g., fins 10, 11), but does not nucleate for epitaxial growth from insulator surfaces (e.g., the top spacer layer 44).

Sections of a metallization layer 50 comprised of a conductor, such as a metal silicide, tungsten, or cobalt, are formed on the top source/drain regions 46 and the top source/drain regions 48. The metallization layer 50 may be formed by filling with the conductor, followed by chemical mechanical polishing (CMP) and recess. Caps 52 comprised of a dielectric material, such as silicon nitride ($Si_3N_4$), are formed that encapsulate the top source/drain regions 46, the top source/drain regions 48, and the metallization layer 50. The caps 52 may be formed by filling with the dielectric material, followed by chemical mechanical polishing (CMP).

The resulting structure includes vertical-transport field-effect transistors 80 formed using fins 10, as well as vertical-transport field-effect transistors 82 formed using fins 11. The vertical-transport field-effect transistors 80 and the vertical-transport field-effect transistors 82 may be of complementary types, and may be single-fin device structures. Each of the vertical-transport field-effect transistors 80 includes one of the bottom source/drain regions 12, one of the top source/drain regions 46, one of the fins 10, and one of the gate stack sections 26a. The gate stack section 26a of some of the vertical-transport field-effect transistors 80 is covered by a section of the metal gate capping layer 40 and, for those gate stack sections 26a that are to be contacted, the metal gate capping layer 40 is absent. Similarly, each of the vertical-transport field-effect transistors 82 includes one of the bottom source/drain regions 14, one of the top source/drain regions 48, one of the fins 11, and one of the gate stack sections 26b. The gate stack section 26b of some of the vertical-transport field-effect transistors 82 is covered by a section of the metal gate capping layer 40 and, for those gate stack sections 26b that are to be contacted, the metal gate capping layer 40 is absent. Although not shown, the gate stack section 26b of one or more of the vertical-transport field-effect transistors 82 may be covered over the active area by one of the sections of the dielectric layer 38.

Figure 8:
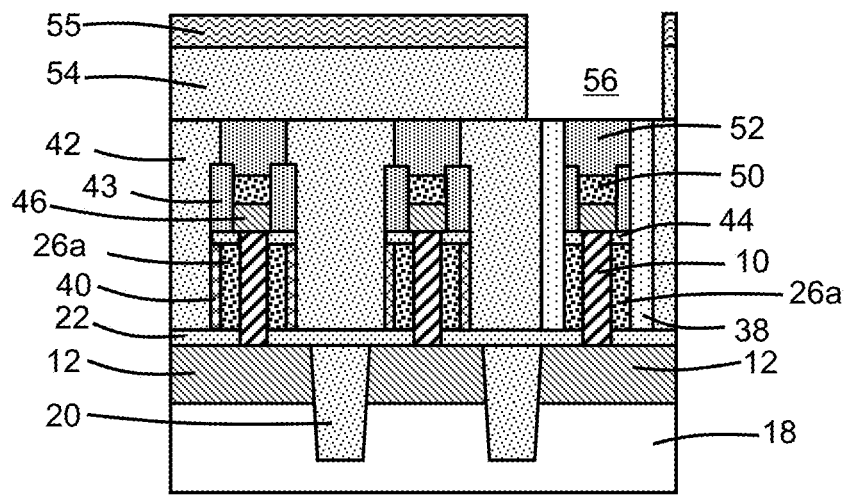
Figure 8A:
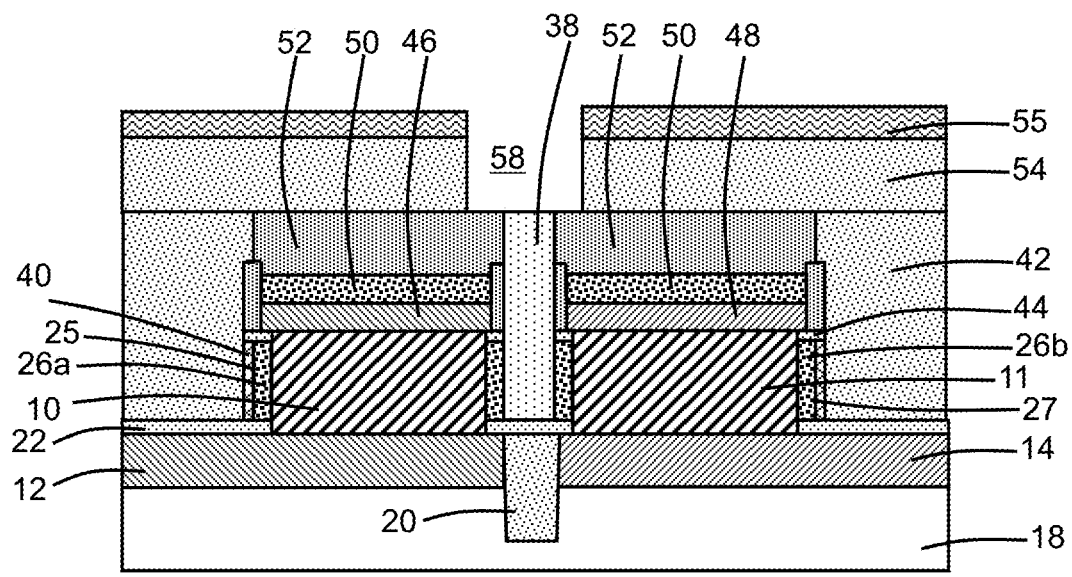

With reference to FIGS. 8, 8A in which like reference numerals refer to like features in FIGS. 7, 7A and at a subsequent fabrication stage, an interlayer dielectric layer 54 is formed over the interlayer dielectric layer 42. A patterned etch mask 55 is formed over the interlayer dielectric layer 54 and is used to form openings 56, 58 in the interlayer dielectric layer 54. The opening 56 is aligned with the section of the dielectric layer 38 serving as placeholders for locations at which contacts to the gate stack sections 26a, 26b are to be formed. The caps 52 protect the top source/drain regions 46, top source/drain regions 48, and metallization layer 50 during the etching process used to form the openings 56, 58. The openings 56, 58 can tolerate a degree of misalignment with the sections of the dielectric layer 38 because a selective etching process is subsequently used to remove the sections of the dielectric layer 38. The etch mask 55 may be removed after the openings 56, 58 are formed.

Figure 9:
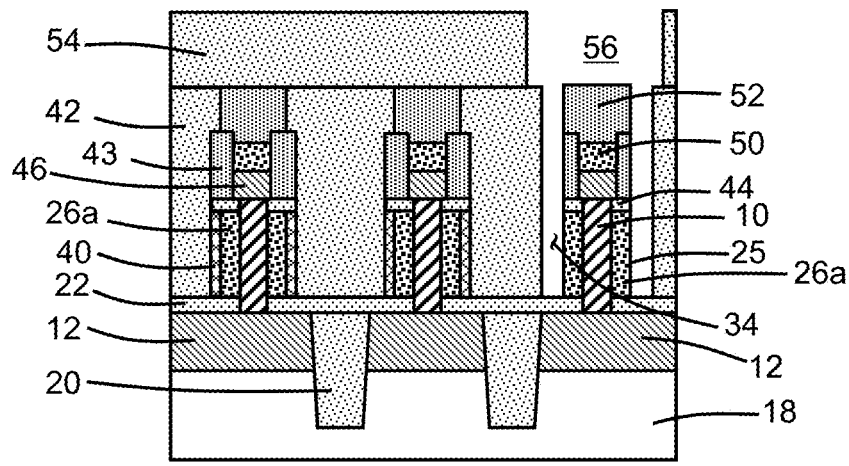
Figure 9A:
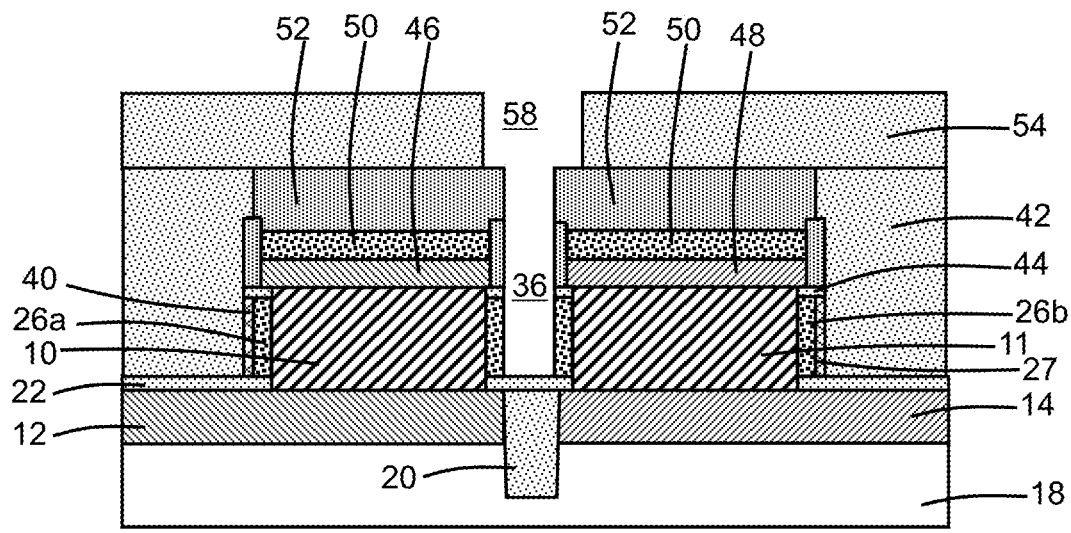

With reference to FIGS. 9, 9A in which like reference numerals refer to like features in FIGS. 8, 8A and at a subsequent fabrication stage, the sections of the dielectric layer 38, which are exposed by the openings 56, 58 in the etch mask 55, are etched back with an etching process to reopen the openings 34, 36. The etching process removes the material of the dielectric layer 38 selective to the materials of the interlayer dielectric layer 42, the caps 52, and the gate stack sections 26a, 26b, and is used to reduce the thickness of the sections of the dielectric layer 38. The vertical surface 25 of one of the gate stack sections 26a is exposed when the opening 34 is reopened. Similarly, the vertical surface 25 of one of the gate stack sections 26a and the vertical surface 27 of one of the gate stack sections 26b, which are adjacent, are exposed when the opening 36 is reopened.

Figure 10:
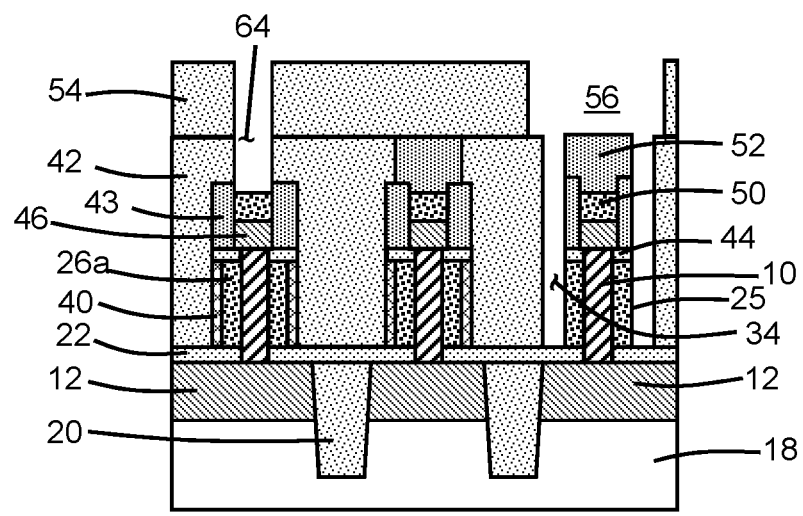
Figure 10A:
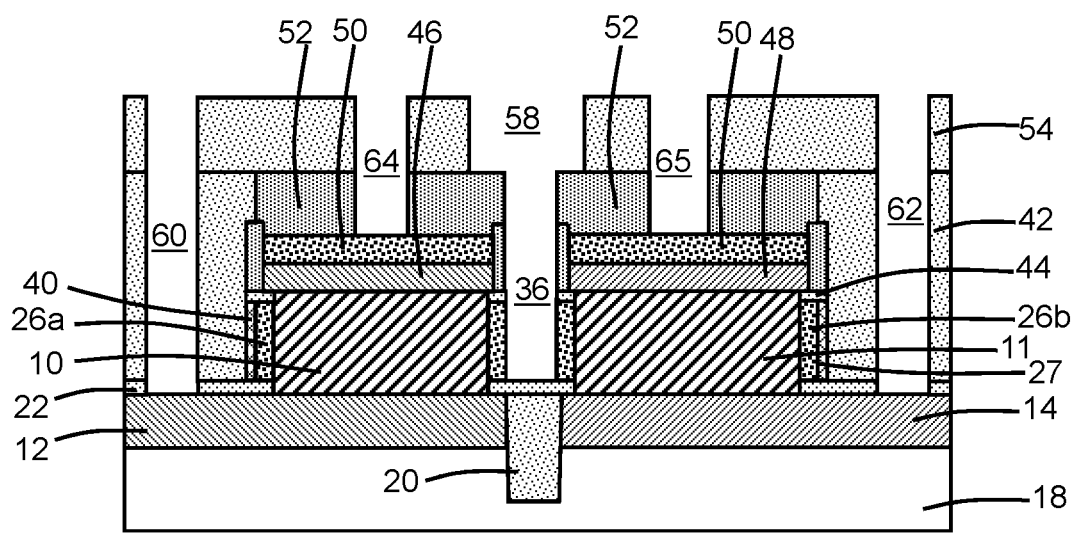

With reference to FIGS. 10, 10A in which like reference numerals refer to like features in FIGS. 9, 9A and at a subsequent fabrication stage, an opening 60 may be formed in the interlayer dielectric layer 42 that extends through the bottom spacer layer 22 to the bottom source/drain region 12 and an opening 62 may be formed in the interlayer dielectric layer 42 that extends through the bottom spacer layer 22 to the bottom source/drain region 14. An opening 64 may be formed in the interlayer dielectric layer 42 that extends through the cap 52 to one of the top source/drain regions 46 and an opening 65 may be formed in the interlayer dielectric layer 42 that extends through the cap 52 to one of the top source/drain regions 48. Masking layers may be applied when the openings 58, 60 and the openings 62, 64 are formed in order to not further etch prior-formed openings to subsequent etching processes.

Figure 11:
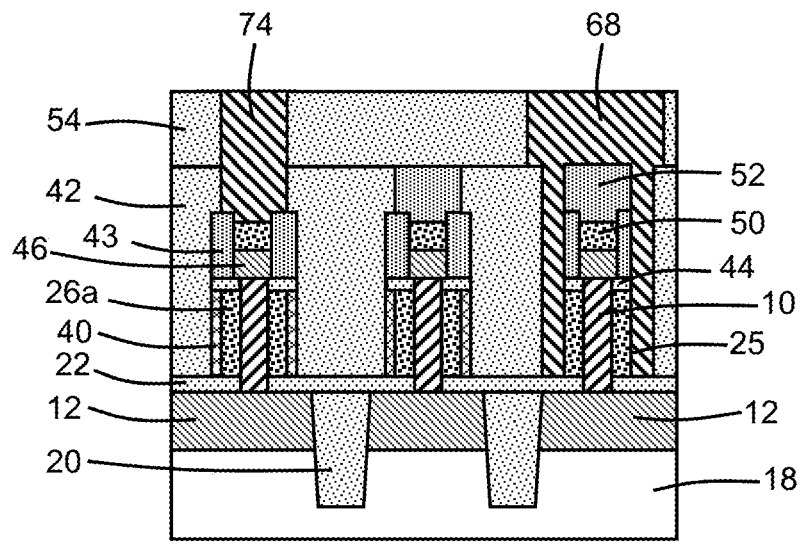
Figure 11A:
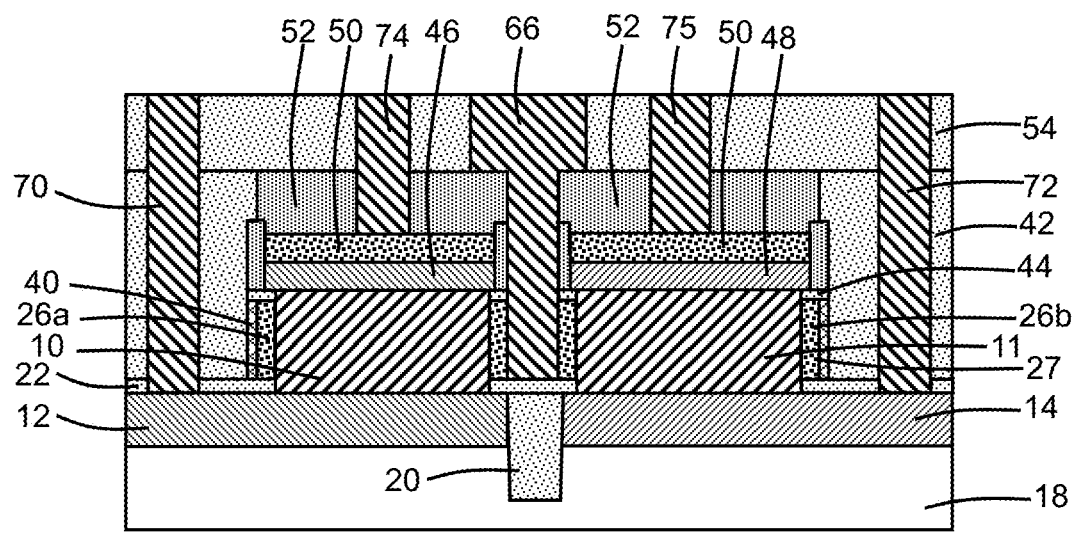

With reference to FIGS. 11, 11A in which like reference numerals refer to like features in FIGS. 10, 10A and at a subsequent fabrication stage, the openings 34, 56, openings 36, 58, and openings 60, 62, 64, 65 (FIG. 9) in the interlayer dielectric layer 42 are filled with one or more conductors to respectively form contacts 66, 68, 70, 72, 74, 75. The contacts 66, 68, 70, 72, 74, 75 may include a liner layer, such as titanium nitride (TiN), and a metal fill layer, such as a metal silicide and/or tungsten (W), that are deposited in the openings 34, 56, openings 36, 58, and openings 60, 62, 64, 65 and then planarized with chemical mechanical polishing (CMP).

The contact 70 extends vertically through the interlayer dielectric layer 42 to the bottom source/drain region 12 and the contact 72 extends vertically through the interlayer dielectric layer 42 to the bottom source/drain region 14. The contact 74 extends vertically through the interlayer dielectric layer 42 to one of the top source/drain regions 46 and the contact 75 extends vertically through the interlayer dielectric layer 42 to one of the top source/drain regions 48. A section of the metal gate capping layer 40 is arranged between each of the contacts 70, 72, 74, 75 and the respective one of the gate stack sections 26a, 26b.

The contact 66 directly contacts the vertical surface 25 of one of the gate sections 26a and the vertical surface 27 of one of the gate sections 26b. These surfaces 25 and 27 are arranged on opposite sides of one of the trench isolation regions 20 and face each other. The contact 66 does not surround either of the involved gate stack sections 26a, 26b, and instead only contacts one side of the involved gate stack section 26a at vertical surface 25 and one side of the involved gate stack section 26b at vertical surface 27.

The contact 68 directly contacts only the vertical surface 25 of one of the gate sections 26a. In each instance, the direct contact results from the absence of the metal gate capping layer 40 due to the utilization of the sections of the dielectric layer 38 as placeholders. The contact 66, which is disposed in the openings 34, 56, extends vertically through the interlayer dielectric layer 42 and is arranged entirely over one of the shallow trench isolation regions 20. The contact 68, which is disposed in the openings 36, 58, extends vertically through the interlayer dielectric layer 42 to the vertical surface 25 of the gate stack section 26a and is arranged entirely over the bottom source/drain region 12. More specifically, the contact 68 is located over the bottom source/drain region 12 entirely laterally inside the shallow trench isolation region 20 that surrounds the bottom source/drain region 12, which defines an active region of the corresponding vertical-transport field-effect transistor 80. The contact 68 is arranged to surround the vertical surface 25 of the related gate stack section 26a. In contrast to contact 66 that contacts the gate stack section 26a associated with one of the fins 10 and the gate stack section 26b associated with one of the fins 11, the contact 68 only contacts the gate stack section 26a associated with a single fin 10. Additional contacts (not shown) similar to contact 68 may be arranged entirely over the bottom source/drain regions 14 and may only contact and surround the gate stack section 26b associated with a single one of the fins 11.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
a first vertical-transport field effect transistor including a bottom source/drain region, a first top source/drain region, a first semiconductor fin that extends from the bottom source/drain region to the first top source/drain region, and a first gate stack section arranged to surround a portion of the first semiconductor fin;
a second vertical-transport field effect transistor including a second top source/drain region, a second semiconductor fin that extends from the bottom source/drain region to the second top source/drain region, and a second gate stack section arranged to surround a portion of the second semiconductor fin;
an interlayer dielectric layer over the first vertical-transport field effect transistor; and a contact located in the interlayer dielectric layer over the bottom source/drain region, the contact extending vertically through the interlayer dielectric layer to contact the first gate stack section, wherein the first gate stack section includes a first section of a work function metal layer, the second gate stack section includes a metal gate capping layer and a second section of the work function metal layer that is arranged between the metal gate capping layer and the portion of the second semiconductor fin, the first gate stack section has a first thickness, and the second gate stack section has a second thickness that is greater than the first thickness.

2. The structure of claim 1 wherein the contact is arranged in direct contact with the first section of the work function metal layer.

3. The structure of claim 2 wherein the first gate stack section is free of the metal gate capping layer.

4. The structure of claim 1 wherein the interlayer dielectric layer is arranged over the first vertical-transport field effect transistor, the first vertical-transport field effect transistor is positioned adjacent to the second vertical-transport field effect transistor, and a portion of the interlayer dielectric layer is arranged between the first gate stack section and the second gate stack section.

5. The structure of claim 4 further comprising:

a trench isolation region arranged between the first vertical-transport field effect transistor and the second vertical-transport field effect transistor, wherein the portion of the interlayer dielectric layer is arranged over the trench isolation region.

6. The structure of claim 5 wherein the portion of the interlayer dielectric layer is arranged between the contact and the second gate stack section.

7. The structure of claim 6 wherein the portion of the interlayer dielectric layer is arranged to fully isolate the contact from the second gate stack section.

* * * * *